US007611600B2

(12) United States Patent
Tsujimoto et al.

(10) Patent No.: US 7,611,600 B2
(45) Date of Patent: Nov. 3, 2009

(54) STICKING APPARATUS AND STICKING METHOD

(75) Inventors: Masaki Tsujimoto, Tokyo (JP); Takahisa Yoshioka, Tokyo (JP); Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 579 days.

(21) Appl. No.: 11/587,853

(22) PCT Filed: Apr. 27, 2005

(86) PCT No.: PCT/JP2005/007954

§ 371 (c)(1),
(2), (4) Date: Oct. 27, 2006

(87) PCT Pub. No.: WO2005/106945

PCT Pub. Date: Nov. 10, 2005

(65) Prior Publication Data

US 2007/0227648 A1 Oct. 4, 2007

(30) Foreign Application Priority Data

| Apr. 28, 2004 | (JP) | 2004-133069 |
| May 26, 2004 | (JP) | 2004-155596 |
| Dec. 8, 2004 | (JP) | 2004-355312 |

(51) Int. Cl.
*B32B 37/26* (2006.01)
*B29C 65/02* (2006.01)
*B29C 63/00* (2006.01)
*C09J 5/06* (2006.01)
*B32B 38/10* (2006.01)
*B32B 38/04* (2006.01)

(52) U.S. Cl. ............ 156/249; 156/267; 156/308.2; 156/344; 156/510; 156/537; 156/583.1; 156/584

(58) Field of Classification Search ............... 156/184, 156/185, 247, 249, 250, 267, 269, 289, 308.2, 156/309.6, 344, 499, 510, 522, 537, 542, 156/580, 582, 583.1, 584; 427/146–148, 427/209, 289, 331

See application file for complete search history.

(56) References Cited

U.S. PATENT DOCUMENTS 4,865,677 A * 9/1989 Matsushita et al. ......... 156/353
4,867,821 A * 9/1989 Morgan ..................... 156/152

(Continued)

FOREIGN PATENT DOCUMENTS

EP        307509 A2 *   3/1989

(Continued)

OTHER PUBLICATIONS

English Abstract of JP 2002-176011.*

(Continued)

*Primary Examiner*—Philip C Tucker
*Assistant Examiner*—Sing P Chan
(74) *Attorney, Agent, or Firm*—Westerman, Hattori, Daniels & Adrian, LLP

(57) ABSTRACT

A sticking apparatus 10 includes a sticking table 11 supporting a semiconductor wafer W and a sticking unit 12 sticking a heat sensitive adhesive sheet S to the semiconductor wafer W. The sticking unit 12 includes a peeling section that, when paying out a raw sheet L having adhesive sheet S laminated to one side face of a release liner PS, peels off the release liner PS and the adhesive sheet S and a sheet preliminary peeling unit 40 provided at an upstream side of the peeling section in a pay-out direction of the raw sheet. The sheet preliminary peeling unit 40 includes a moving member 50 that moves to and from in a state of being pinched between the release liner PS and the adhesive sheet S. The preliminarily peeled-off release liner PS and adhesive sheet S are temporarily re-bonded by a temporary re-bonding unit 41, enabling to stick the adhesive sheet S on the wafer W.

12 Claims, 7 Drawing Sheets

U.S. PATENT DOCUMENTS

| | | | | |
|---|---|---|---|---|
| 4,925,515 | A * | 5/1990 | Yoshimura et al. | 156/250 |
| 4,980,011 | A * | 12/1990 | Gruber et al. | 156/361 |
| 5,310,442 | A * | 5/1994 | Ametani | 156/353 |
| 5,431,767 | A * | 7/1995 | Koza et al. | 156/350 |
| 5,472,554 | A * | 12/1995 | Ko et al. | 156/361 |
| 5,658,420 | A * | 8/1997 | Rossini | 156/504 |
| 5,688,354 | A * | 11/1997 | Ko et al. | 156/267 |
| 5,808,274 | A * | 9/1998 | Lee | 219/121.72 |
| 5,961,768 | A * | 10/1999 | Tsujimoto | 156/285 |
| 6,080,263 | A * | 6/2000 | Saito et al. | 156/253 |
| 6,238,515 | B1 * | 5/2001 | Tsujimoto et al. | 156/379.8 |
| 6,258,198 | B1 * | 7/2001 | Saito et al. | 156/229 |
| 6,500,291 | B1 * | 12/2002 | Okada et al. | 156/230 |
| 6,689,245 | B2 * | 2/2004 | Tsujimoto | 156/267 |
| 6,698,488 | B2 * | 3/2004 | Ishinoda | 156/496 |
| 6,715,524 | B2 * | 4/2004 | Chen et al. | 156/540 |
| 6,767,426 | B1 * | 7/2004 | Yamamoto | 156/270 |
| 6,803,320 | B2 * | 10/2004 | Yamamoto | 438/710 |
| 6,868,884 | B2 * | 3/2005 | Briese | 156/358 |
| 7,051,428 | B2 * | 5/2006 | Jeong et al. | 29/729 |
| 7,063,757 | B2 * | 6/2006 | Jacot et al. | 156/64 |
| 7,122,447 | B2 * | 10/2006 | Abe | 438/460 |
| 7,438,776 | B2 * | 10/2008 | Kobayashi et al. | 156/64 |
| 7,503,365 | B2 * | 3/2009 | Ametani | 156/353 |
| 7,520,309 | B2 * | 4/2009 | Priewasser | 156/382 |
| 2001/0002569 | A1 * | 6/2001 | Lee et al. | 83/873 |
| 2002/0056523 | A1 * | 5/2002 | Ishinoda | 156/496 |
| 2003/0016592 | A1 * | 1/2003 | Katakura et al. | 369/13.23 |
| 2003/0062116 | A1 * | 4/2003 | Lee | 156/249 |
| 2003/0131929 | A1 * | 7/2003 | Yamamoto | 156/250 |
| 2003/0226638 | A1 * | 12/2003 | Chen et al. | 156/230 |
| 2004/0007327 | A1 * | 1/2004 | Kobayashi | 156/353 |
| 2005/0282362 | A1 * | 12/2005 | Kobayashi et al. | 438/464 |
| 2006/0177954 | A1 * | 8/2006 | Jeong et al. | 438/33 |
| 2007/0026641 | A1 * | 2/2007 | Ametani | 438/464 |
| 2007/0235131 | A1 * | 10/2007 | Tsujimoto et al. | 156/344 |
| 2009/0095426 | A1 * | 4/2009 | Yoshioka | 156/378 |

FOREIGN PATENT DOCUMENTS

| | | | |
|---|---|---|---|
| JP | 61-127429 A | | 6/1986 |
| JP | 2001-146357 A | | 5/2001 |
| JP | 2002176011 A | * | 6/2002 |
| JP | 2003-234392 A | | 8/2003 |
| JP | 2003-257898 A | | 9/2003 |
| JP | 2004-40114 A | | 2/2004 |
| JP | 2008172159 A | * | 7/2008 |

OTHER PUBLICATIONS

English Abstract of JP 2008-172159.*
English Abstract of EP 307509.*
International Search Report of PCT/JP2005/007954, date of mailing Aug. 16, 2005.

* cited by examiner

STICKING APPARATUS AND STICKING METHOD

TECHNICAL FIELD

The present invention relates to a sticking apparatus and a sticking method, in particular, to a sticking apparatus and a sticking method in which the occurrence of wrinkles and the mixing of air bubbles can be prevented when an adhesive sheet is stuck on a plate-like member such as a semiconductor wafer or the like.

BACKGROUND ART

Conventionally, after separating a semiconductor wafer (hereinafter, simply referred to as "wafer") on which a circuit surface is formed into individual chips, each chip is picked up and bonded on a lead frame (die bonding). The die bonding can be carried out in such a way that a heat sensitive adhesive sheet for die bonding is stuck in advance, in a wafer-processing step.

A sticking apparatus of the adhesive sheet has been disclosed, for instance, in the patent document 1. The sticking apparatus disclosed in the patent document 1 is arranged to include a table that sucks and supports a wafer in a state that a rear surface side of the wafer is positioned so as to be an upper face side thereof, a sheet supplying unit that supplies an adhesive sheet for die bonding to the upper face side of the wafer, and a press roll that presses the adhesive sheet supplied to the upper face side of the wafer to stick the adhesive sheet to the wafer. Herein a cover sheet (a release liner) is temporarily bonded to one side face of the adhesive sheet, and after the adhesive sheet is stuck on the wafer, the release liner is peeled off.

[Patent document 1] Japanese Patent Application Laid-open No. 2003-257898

DISCLOSURE OF THE INVENTION

PROBLEMS TO BE SOLVED BY THE INVENTION

Conventionally, since a raw sheet of the adhesive sheet has multi-layered structure with the release liner, the release liner is peeled off at a peeling section and wound up in a prior stage of the adhesive sheet sticking on the rear surface of the wafer. There happens sometimes, however, such a problem that the quality standard of some raw sheets do not conform with required product accuracy. For instance, in some cases, temporary adhesive strength between the adhesive sheet and the release liner is not uniform in an extending direction of the raw sheet. Accordingly, in the case where such a raw sheet is mixed as the adhesive sheet and the release liner in a specific area along the extending direction are temporarily bonded to each other more strongly than in other areas, there is a tendency that a peeling-off is not carried out at an original peeling-off position in the peeling section but delayed peeling-off is brought about and the adhesive sheet is trailed by the release liner, resulting in that the adhesive sheet is pulled towards a winding side of the release liner. In this case, an unintended tension force is generated in the adhesive sheet between the peeling section and the press roll for pressing the adhesive sheet to the wafer, which causes the occurrence of warp deformation or wrinkles on the wafer after sticking operation.

Moreover, in the case where the adhesive sheet is stuck on the wafer together with the release liner, peeling-off of the release liner in the area having strong temporary adhesive strength may cause inclusion of the adhesive sheet in winding, if the adhesive sheet is not completely bonded to the wafer.

Then, as shown in FIG. 8, such an arrangement is considered that a preliminary peeling unit 200 is provided in course of paying out the raw sheet L in which the release liner PS is temporarily bonded to the adhesive sheet S, and the release liner PS is peeled off preliminarily from the adhesive sheet S before sticking the adhesive sheet S on the wafer W.

With such an arrangement, however, in the case where the adhesive sheet S is a heat sensitive adhesive sheet, there occur the following disadvantages. That is, once the adhesive sheet S is peeled off from the release liner PS, which blocks temporary re-bonding, the adhesive sheet S tends to get wrinkled or sagged. Consequently, when the adhesive sheet S is bonded to the wafer W, bonding operation is carried out in a state of involving wrinkles and air bubbles therein, which produces massive scale of product defects.

OBJECT OF THE INVENTION

The present invention has been proposed in view of the above disadvantages. An object of the present invention is to provide a sticking apparatus and a sticking method that can perform a stable peeling-off to prevent an unnecessary tension force from being applied to the adhesive sheet, even when adhesive strength between the release liner and the adhesive sheet in a raw sheet state of the adhesive sheet is varied.

Another object of the present invention is to provide a sticking apparatus and a sticking method, in which peeling-off strength between the release liner and the adhesive sheet can be equalized and thereby sticking of the adhesive sheet on the plate-like member can be performed with predetermined tension force by means of temporary re-bonding after the preliminary peeling-off, and thus a press force by the press roll is imparted to the adhesive sheet through the release liner, enabling to stick the adhesive sheet while precluding the occurrence of wrinkles or the mixing of air bubbles or the like.

MEANS FOR SOLVING THE PROBLEMS

To achieve the objects, the present invention is arranged so that a sticking apparatus includes a sticking table supporting a plate-like member and a sticking unit that sticks an adhesive sheet to the plate-like member, wherein:

the sticking unit includes a peeling section that, in course of paying out a raw sheet in which the adhesive sheet is temporarily laminated to one side face of a release liner, peels off the release liner and the adhesive sheet; and a preliminary peeling unit that is provided at an upstream side of the peeling section in a pay-out direction of the raw sheet.

Also, the present invention is arranged so that a sticking apparatus includes a sticking table supporting a plate-like member and a sticking unit that sticks an adhesive sheet to the plate-like member, wherein:

the sticking unit includes a preliminary peeling unit that, in course of paying out a raw sheet in which the adhesive sheet is temporarily bonded to one side face of a release liner, peels off the adhesive sheet from the release liner, a temporary re-bonding unit that re-bonds temporarily the preliminarily peeled-off adhesive sheet to the release liner, and a press roll that presses the adhesive sheet to the plate-like member; and the release liner is pressed by the press roll in a state that the temporarily re-bonded adhesive sheet is directed to a surface of the plate-like member, thus sticking the adhesive sheet on the plate-like member.

According to the present invention, the plate-like member may be a semiconductor wafer and the adhesive sheet may be a heat sensitive adhesive sheet for die bonding.

Further, the plate-like member may be a semiconductor wafer and the adhesive sheet may be a protection sheet that is stuck to form a protection film.

Furthermore, the preliminary peeling unit may include a moving member that is movable in the pay-out direction of the raw sheet, wherein the moving member moves in a state of being pinched between the release liner and the adhesive sheet.

The moving member may be composed of a piece which is provided with a plane along the pay-out direction or a roll-shaped member.

Still further, a sticking method according to the present invention in which a raw sheet having an adhesive sheet bonded temporarily to one side face of a release liner is paid out to stick the adhesive sheet on a plate-like member, comprises the steps of:

peeling off the adhesive sheet preliminarily from the release liner in course of paying out the raw sheet; and then sticking the adhesive sheet to the plate-like member by pressing the same to the plate-like member in a state that the adhesive sheet is directed to the plate-like member.

Still furthermore, a sticking method according to the present invention in which a raw sheet that an adhesive sheet is temporarily bonded to one side face of a release liner is paid out to stick the adhesive sheet to a plate-like member, comprises the steps of:

peeling off the adhesive sheet preliminarily from the release liner in course of paying out the raw sheet;

re-bonding temporarily the adhesive sheet to the release liner that is peeled-off preliminarily; and then sticking the adhesive sheet to the plate-like member by pressing the same to the plate-like member in a state that the temporarily re-bonded adhesive sheet is directed to the plate-like member.

In the sticking method, the adhesive sheet may be a heat sensitive adhesive sheet.

Also, the adhesive sheet may be a protection sheet that is stuck to form a protection film.

In the sticking method, the plate-like member may be a semiconductor wafer.

Moreover, in the sticking method, the plate-like member may be a semiconductor wafer that is back-ground.

Further, in the sticking method, the temporary re-bonding step may be carried out by imparting heat or static electricity.

In the present document, "temporary bonding" is a state showing initial adhesion properties of such a degree that, when the adhesive sheet is stuck on an object to be stuck (hereinafter simply referred to as "object") such as wafer or the like and cut in accordance with a shape or the like of the object, the adhesive sheet is not peeled off or turned up in an area where the same is stuck. "Complete bonding" is a state showing adhesion properties of stronger bonding than temporary bonding with such a degree that the adhesive sheet is not peeled off from the object in an operation of the following step. Moreover, when the adhesive sheet is a heat-curing type, the complete bonding indicates a bonding state before curing.

EFFECT OF THE INVENTION

According to the present invention, when the adhesive sheet is paid out from the raw sheet, the adhesive sheet can be peeled off preliminarily from the release liner at the upstream side of the peeling section in the pay-out direction. Thus, even when there is an area locally where temporary adhesive strength is excessively strong, a peeling-off delay at the peeling section can be prevented; an adhesive sheet area that is stuck on the plate-like member such as wafer or the like can be free from tension force; and warp deformation after the sticking can also be prevented.

In addition, it is arranged so that temporary re-bonding is performed after the preliminary peeling-off. Therefore, the occurrence of wrinkles or sagging or the like due to the impossibility of temporary re-bonding of the adhesive sheet to the release liner can be effectively prevented; and when the adhesive sheet is bonded to the plate-like member, such a disadvantage that sticking between the adhesive sheet and the plate-like member is performed in a state of involving wrinkles or air bubbles therein can be eliminated.

BRIEF DESCRIPTION OF DRAWINGS

FIG. 1 is a front view of a sticking apparatus according to a first embodiment showing schematically an initial state of sticking an adhesive sheet on a wafer.

FIG. 2 is a front view schematically illustrating the operation to cut the adhesive sheet in a width direction after sticking the adhesive sheet.

FIG. 3 is a perspective view schematically showing a sticking table and an interlock mechanism.

FIG. 4 is a partial sectional view of FIG. 3.

FIG. 5 is a perspective view schematically showing a preliminary peeling unit.

FIG. 6 is a front view of a sticking apparatus according to a second embodiment showing schematically an initial state of sticking an adhesive sheet on a wafer.

FIG. 7 is a perspective view schematically showing a preliminary peeling unit and a temporary re-bonding unit in the sticking apparatus according to the second embodiment.

FIG. 8 is a schematic front view in order to illustrate a problem in the case where a preliminary peeling-off is carried out to stick an adhesive sheet together with a release liner on a wafer.

Figure 1:
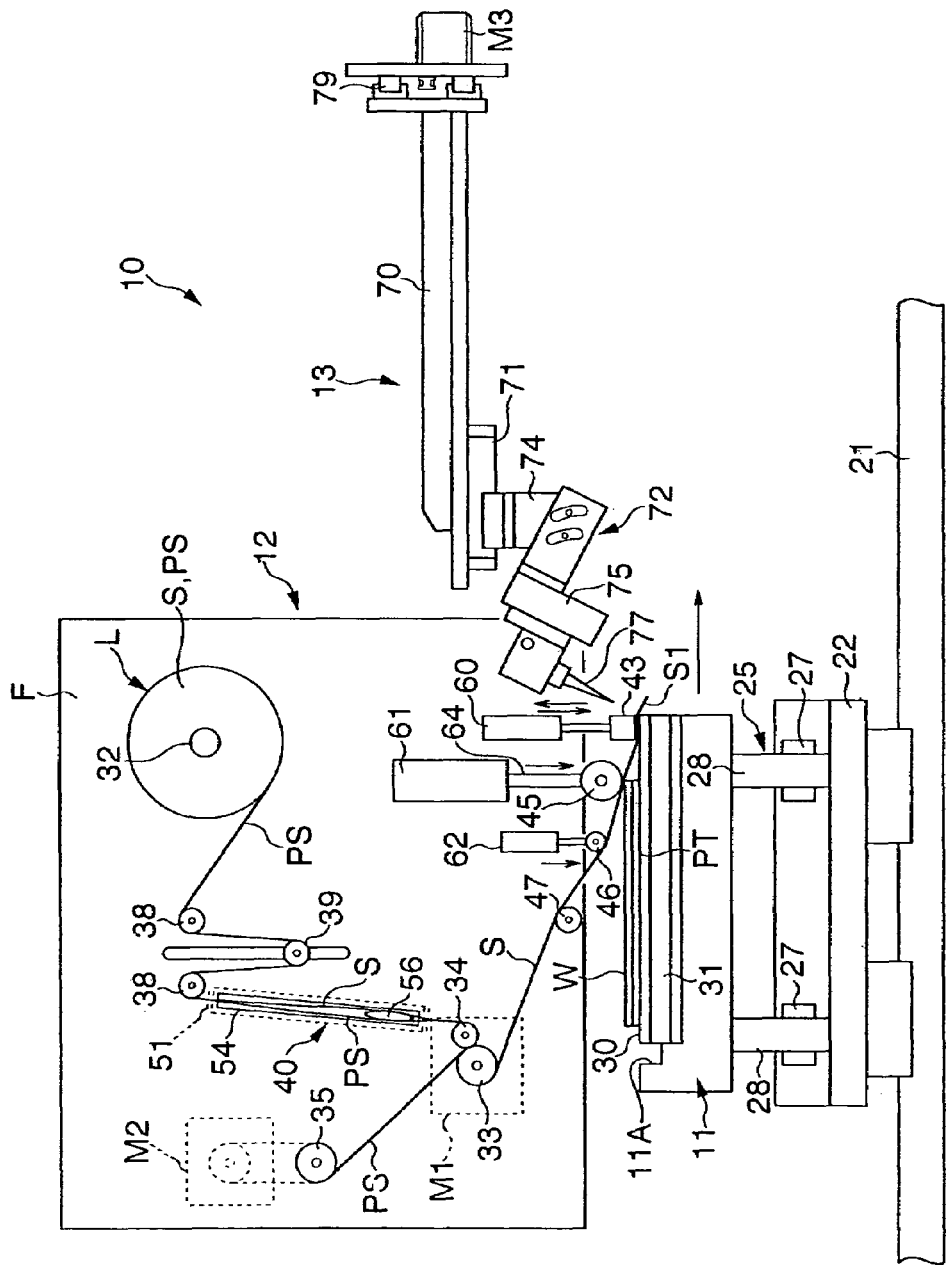
[FIG. 1]

EXPLANATION OF CODES 10 sticking apparatus
11 sticking table
12 sticking unit
13 cutting means
33 drive roll (peeling section)
34 pinch roll (peeling section)
45 press roll
40 preliminary peeling unit
41 temporary re-bonding unit
50 moving member
56 piece body (shifting member)

W semiconductor wafer
PS release liner
S adhesive sheet (heat sensitive adhesive sheet)

BEST MODE FOR CARRYING OUT THE INVENTION

Hereinafter, an embodiment of the present invention will be described with reference to the drawings.

First Embodiment

FIG. 1 is a front view schematically showing a sticking apparatus that sticks an adhesive sheet on a rear surface side of a wafer. In FIG. 1, a sticking apparatus 10 includes a sticking table 11 that receives a wafer W as a plate-like member via a conveyance means in a former step and supports the wafer W and a sticking unit 12 that sticks a heat sensitive adhesive sheet S for die bonding on the rear surface side (upper face side) of the wafer W sucked by the sticking table 11. At a side of the sticking unit 12, a cutting means 13 that cuts the adhesive sheet S in the width direction for every wafer W is disposed. A protection tape PT is stuck preliminarily on a circuit surface side of the wafer W. The wafer W is supported in a state where the surface thereof on which the protection tape PT is stuck comes in contact with an upper face of the sticking table 11.

Figure 3:
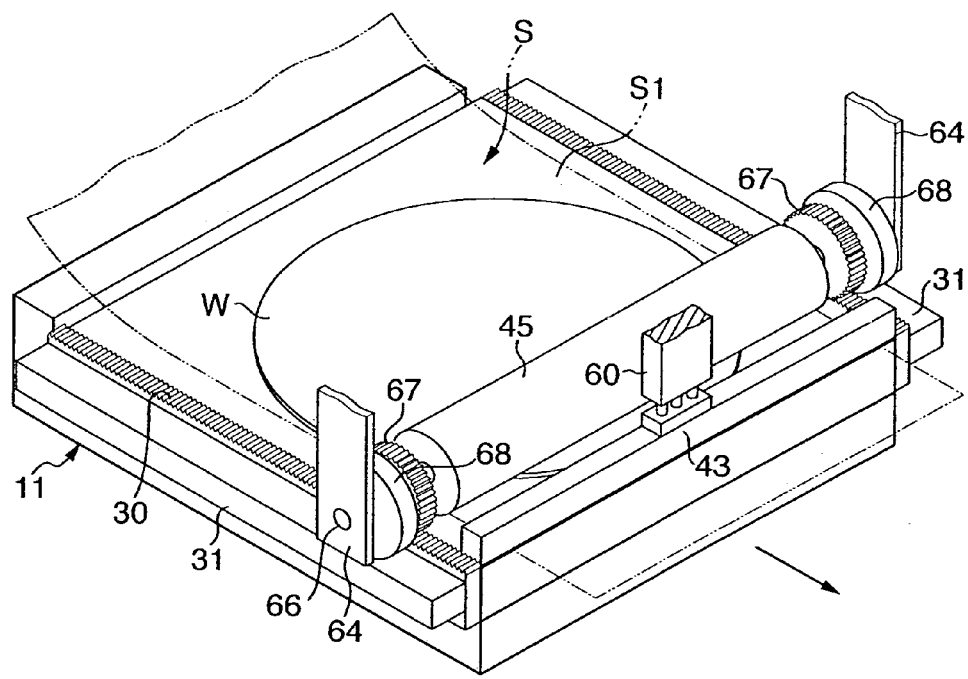
[FIG. 3]
Figure 4:
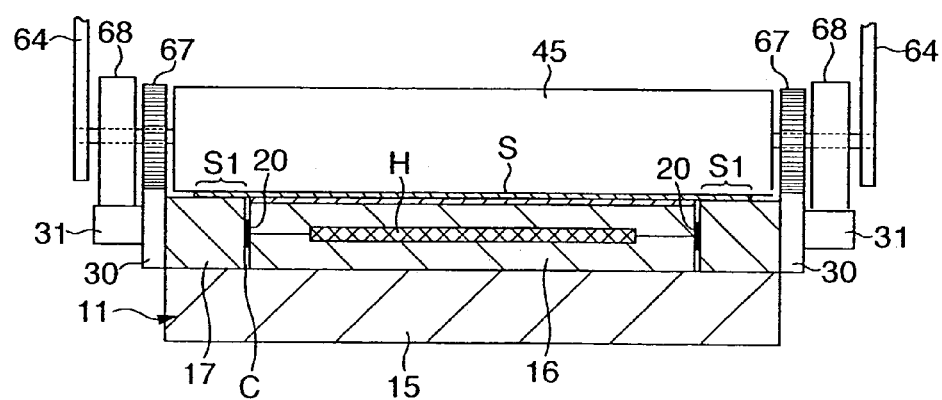
[FIG. 4]

The sticking table 11 is arranged in such a way that the upper face side thereof is formed as a suction face, and the temperature is maintained at a predetermined temperature that the adhesive sheet S can be melted to a settled extent enabling to bond (temporary bonding) to the wafer W. As shown in FIG. 3 and FIG. 4, the sticking table 11 is arranged to include a base table 15, an inner table section 16 that is provided at an upper face side of the base table 15 and an outer table section 17 that encloses the inner table section 16. The inner table section 16 is provided in substantially the same plane shape as the wafer W to form a supporting surface of the wafer W and includes a heater H therein so that the wafer W is maintained at a predetermined temperature. Also, a heat transmission member 20 is disposed in a clearance C formed between the inner table section 16 and the outer table section 17. The heat transmission member 20 is arranged so that the outer table section 17 is maintained to be a lower temperature than the inner table section 16. Thus, a redundant portion of adhesive sheet S1 which protrudes outside the wafer W is bonded to the outer table section 17 with weaker adhesion. Accordingly, when the adhesive sheet S is stuck on the wafer W, wrinkles or the like are not generated on the wafer W.

Figure 2:
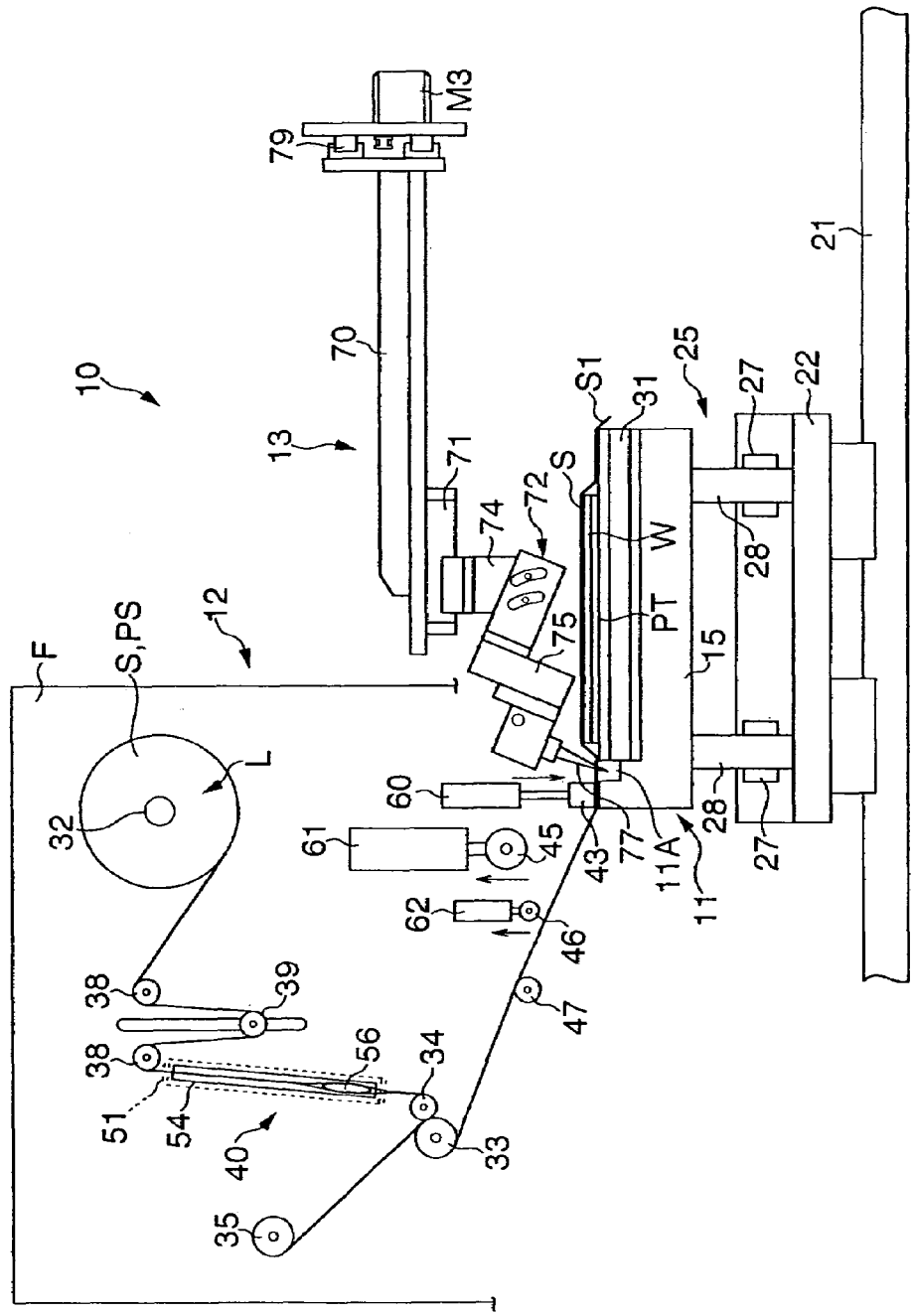
[FIG. 2]

Further, as shown in FIG. 1 and FIG. 2, the sticking table 11 is supported by a slide plate 22 movable on a guide rail 21. The sticking table 11 is arranged to be movable to and from between a position capable to receive the wafer W in the former step and a position behind passing through rightward underneath the sticking unit 12. Furthermore, the sticking table 11 is provided to be movable in the vertical direction via a lifting unit 25. The lifting unit 25 is arranged to include a guide block 27 that is fixed on the slide plate 22, a leg member 28 that is suspended from a bottom face side of the base table 15 and is guiding the vertical direction movement along the guide block 27, a lifting force imparting mechanism that is composed of an unshown cylinder or the like, a pair of racks 30, 30, each of which is disposed at an outer surface side of each outer table section 17, and guide bars 31, 31, each of which is disposed at an outer surface side of each of the racks 30, 30.

Figure 5:
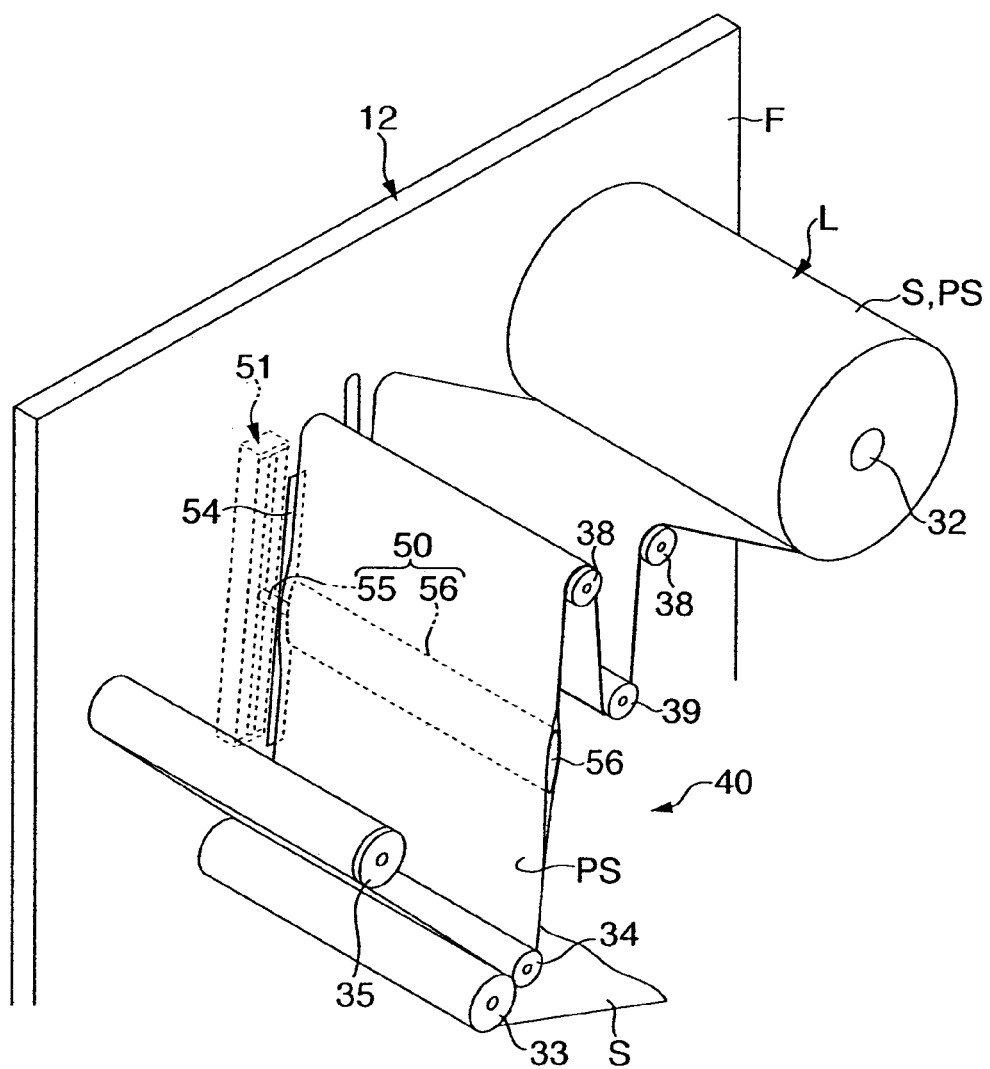
[FIG. 5]

As shown in FIG. 1 and FIG. 5, the sticking unit 12 is disposed within a region of a plate-shaped frame F that is disposed above the sticking table 11. The sticking unit 12 is arranged to include a support roll 32 that supports a raw sheet L, in which the adhesive sheet and a release liner PS are temporarily bonded together, and wound in a roll shape enabling to be supplied; a drive roll 33 and a pinch roll 34 that impart a pay-out force to the raw sheet L; a winding roll 35 that winds the release liner PS laminated on the adhesive sheet S; two guide rolls 38, 38 that are disposed between the support roll 32 and the pinch roll 34; a dancer roll 39 that is provided between the guide rolls 38, 38; a preliminary peeling unit 40 that is provided at an upstream side in a pay-out direction of the raw sheet of the adhesive sheet S relative to the pinch roll 34; a press member 43 that presses a lead end area of the adhesive sheet S, from which the release liner PS has been peeled off, towards the upper face of the sticking table 11 and pinches the lead end area between the two; a press roll 45 that sequentially presses the adhesive sheet S to the rear surface side (upper face side in FIG. 1) of the wafer W for temporary bonding; and a tension roll 46 and a guide roll 47 that are disposed at a position immediately before the press roll 45 in the pay-out direction of the adhesive sheet S. The press roll 45 includes a built-in heater as a heating means. Also, the press member 43 includes a suction section at a bottom face side thereof so as to suck and hold an end portion of the adhesive sheet S.

As shown in FIG. 1 and FIG. 5, the preliminary peeling unit 40 is arranged to include a moving member 50 that is movable along the pay-out direction of the raw sheet L and a cylinder unit 51 that moves the moving member 50. The moving member 50 is arranged to include a support shaft 55 that passes through a slit 54 in a front/rear direction provided in a plane of the frame F and a wing-shaped piece 56 that is fixed to a front edge (above the paper face side edge) of the support shaft 55 and has a substantially equal length or more than a width of the adhesive sheet S from the plane of the frame F to the front. The piece 56 is disposed between the adhesive sheet S and the release liner PS. The piece 56 is formed so that smooth circular arc surfaces, each of which comes in contact with each sheet S and PS, are provided at both left and right sides thereof and each of upper and lower edges thereof is formed in a pointed head shape to have an extremely small curvature profile. Thus, when the piece 56 is moved in the vertical direction by the driving of the cylinder unit 51, the piece 56 forcibly and smoothly separates the adhesive sheet S and the release liner PS that are laminated to perform a preliminary peeling-off in a stage before a peeling-off at a peeling section. The moving member 50 does not prevent to use a roll-shaped member or the like instead of the piece 56.

The drive roll 33, the pinch roll 34 and the winding roll 35 compose a peeling section to peel off the adhesive sheet S and the release liner PS that are in a state of raw sheet. Among the rolls, the rolls 33 and 35 are arranged to be rotationally driven by motors M1 and M2 respectively that are provided at a rear surface side of the frame F. Further, the press member 43, the press roll 45 and the tension roll 46 are provided to be movable in the vertical direction through cylinders 60, 61 and 62 respectively. As shown in FIG. 3 and FIG. 4, both edge sides of the press roll 45 are connected to the cylinder 61 through brackets 64. A pair of pinions 67, 67 that interact with the racks 30 to compose an interlock mechanism are disposed at both edge sides of a rotating center shaft 66. A pair of rollers 68, 68 as a rotator are disposed at further outer positions of the pinions 67. The pinions 67, 67 are provided enabling to be engaged with the racks 30, 30. Meanwhile, the rollers 68, 68 are arranged to rotate on the guide bars 31 regardless of a rotation of the press roll 45.

As shown in FIG. 1 and FIG. 2, the cutting means 13 includes an arm 70 extending along a moving direction of the sticking table 11 and a cutter unit 72 provided to be movable forward/backward through a uniaxial robot 71, which is disposed on a bottom face in a front-end side (left end side in FIG. 1) of the arm 70. The cutter unit 72 is arranged to include a cutter lifting cylinder 75 that is supported by the bracket 74 moving along the uniaxial robot 71 and a cutter 77 that is attached to a front end of the cutter lifting cylinder 75. Here, the cutter lifting cylinder 75 is attached to the bracket 74 in a state of being rotatable in a substantially vertical plane. Thus, a cutting edge angle of the cutter 77 can be adjusted in a state that a front end position of the cutter 77 moves along a circular arc in the substantially vertical plane. Furthermore, the cutter lifting cylinder 75 is arranged to be movable forward/backward by the uniaxial robot 71 along the extending direction of the arm 70. As shown in FIG. 1, the cutting means 13 is supported to be movable on a guide 79 by the driving of a motor M3. The guide 79 is directed to an orthogonal direction (orthogonal direction to the page in FIG. 1) relative to the moving direction of the sticking table 11. Accordingly, when a front edge of the cutter 77 is set to be inserted into a cutter receiving groove 11A of the sticking table 11 and the entire cutting means 13 moves along the guide 79, the adhesive sheet S can be cut in the width direction.

Then, a sticking method of the adhesive sheet S according to a first embodiment will be described.

The wafer W is transferred to the sticking table 11 in a state that a face, on which the protection tape PT is stuck, is positioned at a bottom face side and is sucked to be supported by the sticking table 11 with the rear surface of the wafer W as an upper face side.

As shown in FIG. 1, when the sticking table 11 is moved to a predetermined position of the sticking unit 12, the lead end area of the adhesive sheet S that is sucked and held at the bottom face side of the press member 43 comes into contact with the upper face of the sticking table 11 by a downward movement of the press member 43. The sticking unit 12 is set so that in an initial operation of laying around the raw sheet L, the piece 56 is sandwiched between the adhesive sheet S and the release liner PS, in a state of being separated from each other. Then, before the lead end of the adhesive sheet S is pressed to the outer table section 17 by the press member 43, the piece 56 once reciprocates from a position shown in FIG. 1 to the upper side so as to form a preliminary peeled off area and then stopped. After that, while the piece 56 is stopped, the press roll 45 moves downward to pinch the adhesive sheet S between the upper face of the wafer W and the same, and the redundant portion of adhesive sheet S1 other than the wafer W area comes in contact with the outer table section 17. Then, the press member 43 releases the suction and moves up. At this time, the rollers 68 provided at both end sides of the press roll 45 comes in contact with an upper face of the guide bars 31, and simultaneously, the pinions 67 engage with the racks 30 to become rotationally movable along the racks 30. In this state, the sticking table 11 is moved rightward in FIG. 1. Owing to the engagement between the racks 30 and the pinions 67, the press roll 45 rotates and the rollers 68 roll to move on the guide bars 31 as a guide surface. Thus, the adhesive sheet S paid out sequentially is stuck to the upper face of the wafer W. In sticking operation, the redundant portion of adhesive sheet S1 that is protruded from a periphery of the wafer W is bonded to the outer table section 17 with weak adhesion.

Therefore, when the press roll 45 is moving on the wafer W while rotating, such a disadvantage does not occur that the wafer W is pulled by tension force of the adhesive sheet S and press force of the press roll 45, resulting in that wrinkles are formed. Note that the press roll 45 is controlled at a predetermined temperature by the built-in heater as the heating means.

As described above, when the adhesive sheet S is stuck to the wafer W and the press member 43 reaches an upper position immediately after passing through the cutter receiving groove 11A, the press member 43 moves downward to make the adhesive sheet S in contact with the sticking table 11 (refer to FIG. 2). After that, the cutter 77 of the cutting means 13 is inserted into the cutter receiving groove 11A, and the arm 70 supporting the cutter unit 72 moves to the orthogonal direction of the paper sheet in FIG. 2 so as to cut the adhesive sheet S in the width direction. After the completion of the cutting in the width direction, the press member 43 sucks the adhesive sheet S positioned at the bottom face side of the press member 43 and returns to the upper position, waiting for bonding operation of successive wafer W. Also, owing to the rising of the cutter lifting cylinder 75, the cutting edge of the cutter 77 is displaced toward a upper position, and the cutting means 13 retreats in a direction of separating from the upper face position of the sticking table 11, that is, to the upper side in FIG. 1.

The wafer that the adhesive sheet S is stuck thereon is transferred via a transfer unit or the like to a periphery cutting device, and the adhesive sheet S is cut along a periphery edge of the wafer W to remove the outer redundant portion of the adhesive sheet.

According to the sticking apparatus 10 of the first embodiment as described above, even when an area of strong temporary adhesion exists partially in a state of raw sheet in which the adhesive sheet S is laminated on the release liner PS, a specific amount along the pay-out direction is peeled off preliminarily by the preliminary peeling unit 40. Accordingly, the adhesive sheet S and the release liner PS after passing through the preliminary peeling unit 40 can be smoothly peeled off at the peeling section immediately after that, which prevents a peeling-off delay. Owing to the prevention of such a peeling-off delay, unnecessary tension force imparting to the adhesive sheet S between the peeling section and the press roll 45 can be prevented, and warp deformation is not generated to the wafer W on which the adhesive sheet S is stuck.

Second Embodiment

Figure 6:
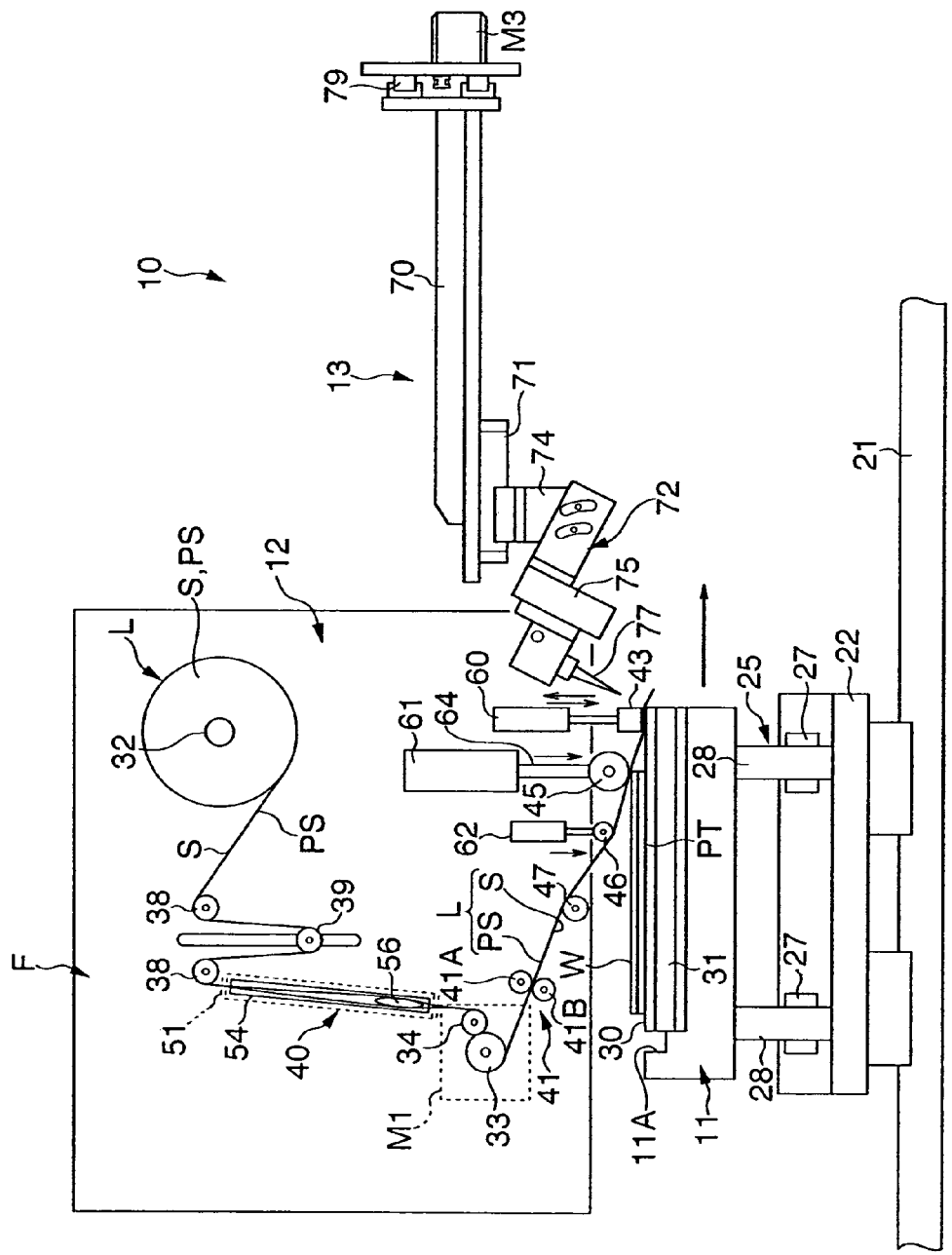
[FIG. 6]
Figure 7:
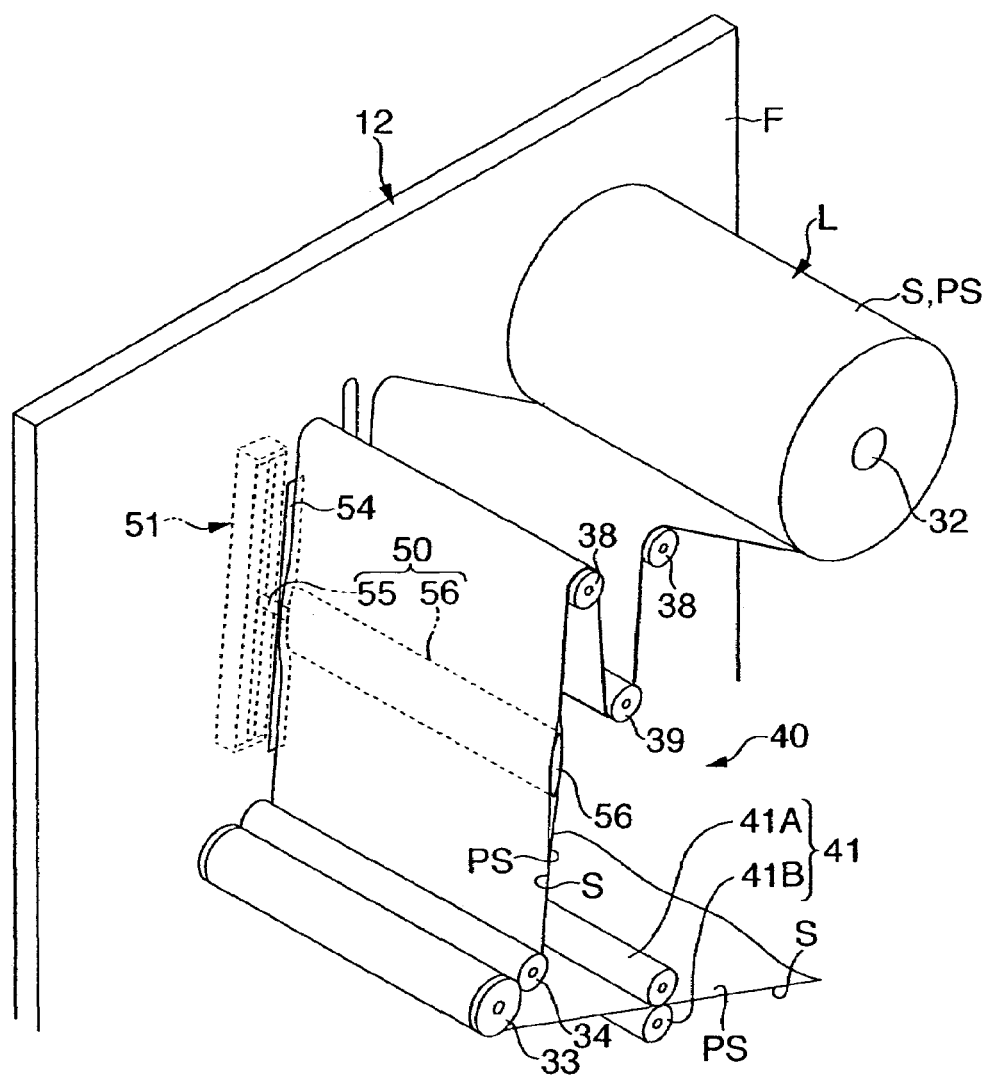
[FIG. 7]

Next, a second embodiment of the present invention will be described with reference to FIG. 6 and FIG. 7. The second embodiment is arranged so that, after the preliminary peeling-off, the adhesive sheet S is temporarily re-bonded to the release liner PS without winding the release liner PS so as to stick the adhesive sheet S on the wafer W.

That is, a temporary re-bonding unit 41 that repeats to bond temporarily the release liner PS to the adhesive sheet S that is preliminarily peeled-off is provided at a downstream side from the drive roll 33. The temporary re-bonding unit 41 is arranged to include a pair of built-in heater type rolls 41A, 41B that are disposed so as to pinch the raw sheet L, or the adhesive sheet S and the release liner PS.

When the adhesive sheet S and the release liner PS that has been preliminary peeled off pass through the rolls 41A, 41B, the adhesive sheet S and the release liner PS are temporarily re-bonded so that temporary adhesive strength becomes constant along the extending direction by the heat of the rolls 41A, 41B. It is arranged so that the temporary adhesive strength can be set variably according to the material and thickness of the adhesive sheet S or the release liner PS, and mechanical properties of the sticking apparatus 10 or the like.

The sticking of the adhesive sheet S according to the second embodiment is performed substantially in the same way as the first embodiment, except the arrangement in which the release liner PS and the adhesive sheet S are temporarily re-bonded, and thus, the press roll 45 comes in contact with the release liner PS to press the release liner PS.

Similar to the first embodiment, the wafer W that the adhesive sheet S of the raw sheet L is stuck thereon as described above is transferred to the periphery cutting device via the transfer unit or the like, and the adhesive sheet S is cut along a periphery edge of the wafer W to remove the outer redundant portion of the adhesive sheet.

The other arrangement and operation are the same as those of the first embodiment.

Figure 8:
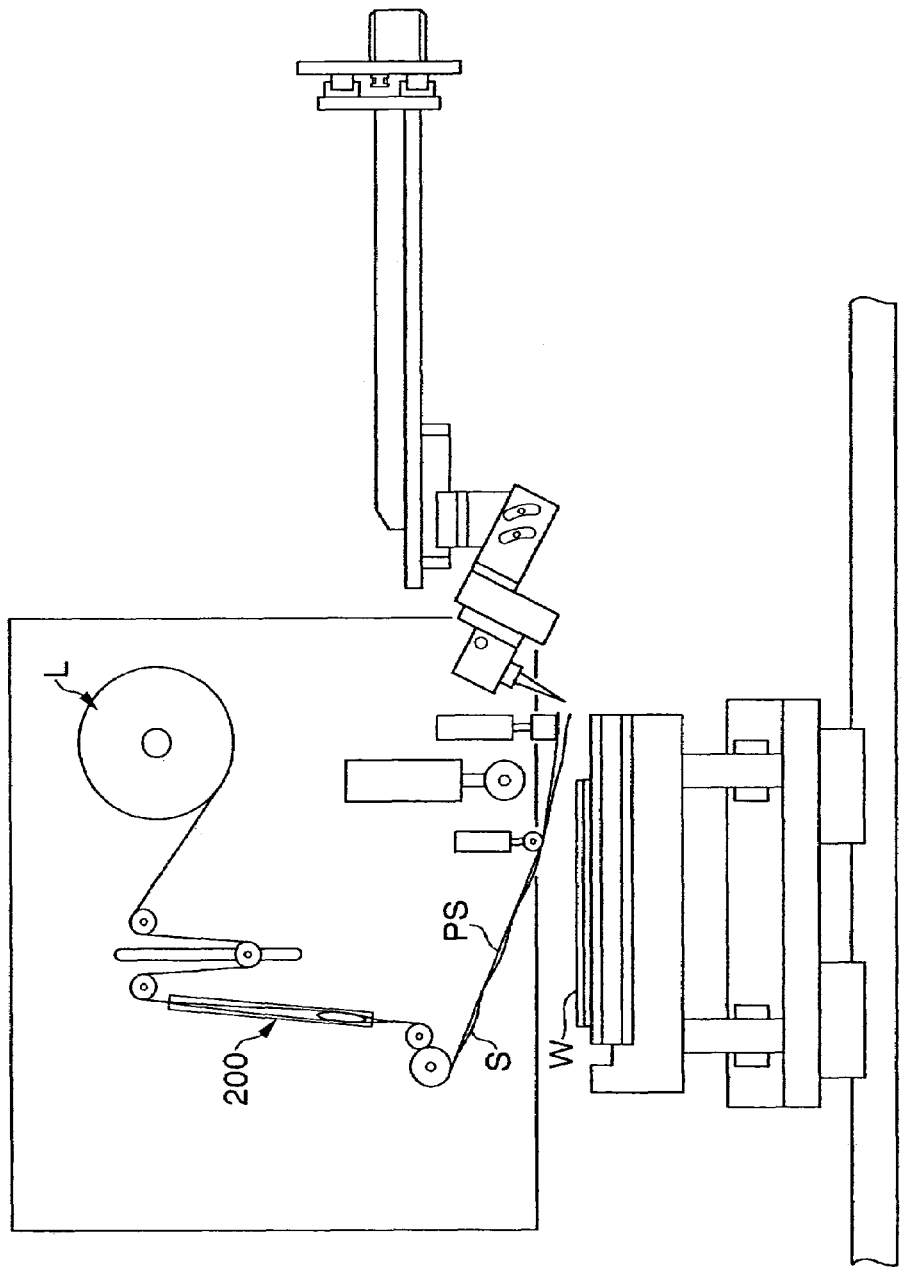
[FIG. 8]

Therefore, according to the second embodiment as described above, it is arranged so that the temporary re-bonding is carried out after the raw sheet L composing of the adhesive sheet S and the release liner PS is preliminarily peeled off, consequently such a disadvantage can be prevented as occurrence of wrinkles or sagging on the adhesive sheet, as shown in FIG. 8, which are caused by the fact that the adhesive sheet S can not be temporarily re-bonded and thereby losing a proper tension force of the adhesive sheet. Accordingly, the adhesive sheet S can be bonded to the wafer W in a state of preventing the wrinkles or the mixing of air bubbles. In addition, the press-roll 45 is arranged to impart a press force to the adhesive sheet S via the release liner PS, and thus, the adhesive does not adhere to the press roll 45.

As described above, the best arrangement and method for carrying out the present invention have been disclosed in the forgoing description. However, the present invention is not limited to the above.

That is, although the present invention has been mainly illustrated and described about specified embodiments, it is possible for ones skilled in the art, if necessary, to add various modifications to shape, position, disposition or the like with respect to the above-described embodiments without departing from the scope of the technical idea and object of the present invention.

For instance, the sticking apparatus 10 according to the embodiments has been illustrated and described as an apparatus that sticks the heat sensitive adhesive sheet S for die bonding on the wafer W, but another sheet may be applied. For instance, a dry resist film or a sheet for forming a protection film or the like may be applicable when stuck on the wafer W.

Further, such a case has been illustrated and described that the object to which the adhesive sheet S is stuck is the wafer W, but the present invention is not limited to it. The object may be other plate-like members.

Furthermore, such a case has been illustrated and described that a pair of rolls 41A, 41B of built-in heater type are adopted as the temporary re-bonding unit 41, but the present invention is not limited to it. That is, the rolls may not be a built-in heater type. In this case, such a chamber may be provided that is maintained at a predetermined heat temperature and the rolls may be disposed in the chamber. Still further, the adhesive sheet S and the release liner PS may be charged with static electricity to bond preliminarily to each other. In short, in the temporary re-bonding according to the present invention, if the temporary adhesive strength can be evenly readjusted along the extending direction of the raw sheet L, any arrangement is acceptable.

The invention claimed is:

1. A sticking apparatus comprising:
a sticking table supporting a plate-like member; and
a sticking unit that sticks an adhesive sheet to said plate-like member, wherein: said sticking unit includes a peeling section that, in course of paying out a raw sheet in which the adhesive sheet is temporarily laminated to one side face of a release liner, peels off the release liner and the adhesive sheet; and a preliminary peeling unit that is provided at an upstream side of the peeling section in a pay-out direction of the raw sheet;
wherein said preliminary peeling unit includes a moving member that is movable in the pay-out direction of the raw sheet;
and the moving member moves in a state of being pinched between the release liner and the adhesive sheet.

2. A sticking apparatus comprising:
a sticking table supporting a plate-like member; and
a sticking unit that sticks an adhesive sheet to said plate-like member, wherein: said sticking unit includes a preliminary peeling unit that, in course of paying out a raw sheet in which the adhesive sheet is temporarily bonded to one side face of a release liner, peels off the adhesive sheet from said release liner, a temporary re-bonding unit that re-bonds temporarily the adhesive sheet preliminarily peeled-off to said release liner, and
said release liner is pressed by a press roll in a state that said temporarily re-bonded adhesive sheet is directed to a surface of said plate-like member;
wherein said preliminary peeling unit includes a moving member that is movable in the pay-out direction of the raw sheet;
and the moving member moves in a state of being pinched between the release liner and the adhesive sheet.

3. The sticking apparatus according to claim 1 or 2, wherein:
said plate-like member is a semiconductor wafer and said adhesive sheet is a heat sensitive adhesive sheet for die bonding.

4. The sticking apparatus according to claim 1 or 2, wherein:
said plate-like member is a semiconductor wafer and said adhesive sheet is a protection sheet that is stuck to form a protection film.

5. The sticking apparatus according to claim 1 or 2, wherein:
said moving member is composed of a piece which is provided with a plane along said pay-out direction or a roll-shaped member.

6. A sticking method in which a raw sheet having an adhesive sheet bonded temporarily to one side face of a release liner is paid out to stick said adhesive sheet on a plate-like member, comprising the steps of:
peeling off the adhesive sheet preliminarily from said release liner in course of paying out said raw sheet with a preliminary peeling unit that includes a moving member that is movable in the pay-out direction of the raw sheet; and the moving member moves in a state of being pinched between the release liner and the adhesive sheet; and
then sticking said adhesive sheet to plate-like member by pressing the adhesive sheet to the plate-like member in a state that said adhesive sheet is directed to said plate-like member.

7. A sticking method in which a raw sheet having an adhesive sheet bonded temporarily to one side face of a release liner is paid out to stick said adhesive sheet to a plate-like member, comprising the steps of:

peeling off the adhesive sheet preliminarily from said release liner in course of paying out said raw sheet with a preliminary peeling unit that includes a moving member that is movable in the pay-out direction of the raw sheet; and the moving member moves in a state of being pinched between the release liner and the adhesive sheet;

re-bonding temporarily said adhesive sheet peeled-off preliminarily to said release liner; and then said re-bonded adhesive sheet is directed to said plate-like member.

8. The sticking method according to claim 6 or 7, wherein: said adhesive sheet is a heat sensitive adhesive sheet.

9. The sticking method according to claim 6 or 7, wherein: said adhesive sheet is a protection sheet that is stuck to form a protection film.

10. The sticking method according to claim 6 or 7, wherein: said plate-like member is a semiconductor wafer.

11. The sticking method according to claim 6 or 7, wherein: said plate-like member is a semiconductor wafer that is back-ground.

12. The sticking method according to claim 7, wherein: said temporarily re-bonding step is carried out by imparting heat or static electricity.

* * * * *